(12) United States Patent
Tanioka et al.

(10) Patent No.: US 6,667,627 B2
(45) Date of Patent: Dec. 23, 2003

(54) PROBE FOR INSPECTING SEMICONDUCTOR DEVICE AND METHOD OF MANUFACTURING THE SAME

(75) Inventors: Michinobu Tanioka, Tokyo (JP); Takahiro Kimura, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/090,957

(22) Filed: Mar. 5, 2002

(65) Prior Publication Data

US 2002/0125901 A1 Sep. 12, 2002

(30) Foreign Application Priority Data

Mar. 6, 2001 (JP) .......................... 2001-061926

(51) Int. Cl.[7] .............................. G01R 31/02; A05K 3/00
(52) U.S. Cl. .................... 324/754; 324/761; 324/158.1; 439/482; 29/842
(58) Field of Search ................................ 324/754, 765, 324/158.1, 758, 761, 72.5, 752, 762; 29/842, 874, 889; 438/106, 118, 127; 439/66, 482, 700; 174/261, 267

(56) References Cited

U.S. PATENT DOCUMENTS

| 5,838,005 A | * | 11/1998 | Majumdar et al. | .......... 250/306 |
| 6,414,501 B2 | * | 7/2002 | Kim et al. | .................. 324/754 |
| 6,499,216 B1 | * | 12/2002 | Fjelstad | ....................... 29/842 |

* cited by examiner

Primary Examiner—Kamand Cuneo
Assistant Examiner—Jimmy Nguyen
(74) Attorney, Agent, or Firm—Michael Best & Friedrich LLC

(57) ABSTRACT

A probe is provided so as to obtain an electrical contact between a semiconductor device having a plurality of first electrodes as external terminals and an inspection substrate having a plurality of second electrodes so as to inspect the semiconductor device. A first substrate has through holes formed at positions corresponding to the first electrodes. Probe pins are fixed in the through holes. A second substrate has a rewiring layer for extending a pitch of the first electrodes and penetration electrodes for drawing out the first electrodes to a back surface. A contact is disposed between the penetration electrodes and the second electrodes and has conductivity and elasticity only in a vertical direction.

20 Claims, 6 Drawing Sheets

PROBE FOR INSPECTING SEMICONDUCTOR DEVICE AND METHOD OF MANUFACTURING THE SAME

BACKGROUND OF THE INVENTION

This invention broadly relates to a probe contacting with an electrode of an LSI (Large Scale Integration) or a bear chip as a semiconductor device. More specifically, this invention is directed to a probe structure suitable for inspecting the LSI or the bear chip, each having a narrow electrode pitch.

Conventionally, the probe is contacted with an external terminal electrode of the semiconductor device to be inspected thereby to obtain an electric contact between the semiconductor device and an inspection substrate, and thus, inspecting the semiconductor device.

As the above mentioned probe, use is made of a metal needle, a metal pin, a membrane sheet with a metal protrusion, a plated silicon whisker and so on.

A method using the metal needle is disclosed in U.S. Pat. No. 5,969,533 (hereinafter, will be referred to as a first prior art), a method using the membrane sheet with the metal protrusion is disclosed in Japanese Unexamined Patent Publication (A) No. Hei. 5-226430 or Japanese Unexamined Patent Publication (A) No. Hei. 5-243344 (hereinafter, will be referred to as a second prior art), and a method using the silicon whisker is disclosed in Japanese Unexamined Patent Publication (A) No. Hei. 11-190748 (hereinafter, will be referred to as a third prior art), respectively.

Hereinafter, description will be made about the above-mentioned prior arts.

First, description will be made about the first prior art with reference to FIG. 1. According to the first prior art, the probe is formed by processing the metal needle made of tungsten, thereby making a pitch narrow.

In a probe structure illustrated in FIG. 1, probe needles 28 each having a root diameter of 190 $\mu$m are laminated with four stages, and a tip pitch of the probe is narrowed to 50 $\mu$m by the use of a shielding plate 27, thus improving positioning accuracy.

Subsequently, description will be made about the second prior art with reference to FIG. 2. In the probe structure according the second prior art, a contact sheet with a metal protrusion (bump) is disposed in opposition to an external electrode of the semiconductor device. As a representative example of the second prior art, a probe card structure is illustrated in FIG. 2.

Referring to FIG. 2, an inspection circuit pattern and an electrode lead 30 are formed on one surface of a flexible insulating film 29. On the tip of the electrode lead 30, a metal protrusion 31 is formed in opposition to the external electrode 2 of the semiconductor device 1. The metal protrusion is contacted with an external terminal electrode 2 with such a structure.

Next, description will be made about the third prior art with reference to FIG. 3. In the probe structure according to the third prior art, a silicon single crystal is grown in a bar shape, and the grown single crystal is plated to thereby form a probe pin.

As illustrated in FIG. 3, wires are drawn out from a contactor substrate 32 with probe pins 3 by using a flexible substrate 33 so as to connect with the inspection substrate.

The aforementioned first prior art has the following problems because the probes are laminated with the four stages through the metal needles and the shielding plates.

First, it is extremely difficult to process the needle and the shielding plate and assemble for the inspection substrate, which results to high cost.

Second, even if the probes are laminated with the four stages, the pitch is equal to 50 $\mu$m at most. Therefore, it is difficult to further narrow the pitch from the viewpoint of rigidity of the metal needle.

Third, the needle becomes long to thereby increase resistance thereof. Consequently, a signal delay is increased also so that it is difficult to obtain high frequency.

According the second prior art, the contact with the external electrode is performed by the metal protrusion. The metal protrusion is kept to a constant height or more not to contact with a circuit surface of the semiconductor device upon contacting. In consequence, the pitch of the metal protrusions is on the order of 60 $\mu$m at least, and therefore it is difficult to make the pitch narrower.

The above-mentioned third prior art has the following problems because a pin material is formed by plating silicon.

First, a signal delay occurs under a high speed by a resistance increase of the pit itself.

Second the contact with the external electrode of the semiconductor device is carried out via the pin plated for a bar-like single silicon crystal, and the wire is flatly drawn out for the external by the use of the flexible substrate and the connector.

Consequently, the resistance is increased by increasing a wire length, and the signal delay takes place by the difference between the wire lengths.

Third, pressing is required to obtain a stable contact by eliminating warping of the inspection substrate as well as height variation of the external terminal electrodes of the semiconductor device. In this circumstance, in case where each variation becomes large, the pin is destroyed readily.

SUMMARY OF THE INVENTION

It is therefore an object of this invention to provide a probe which is capable of suitably inspecting a semiconductor device having a narrow pitch and a method of manufacturing the same.

According to one aspect of this invention, a probe is provided so as to obtain an electrical contact between a semiconductor device having a plurality of first electrodes as external terminals and an inspection substrate having a plurality of second electrodes so as to inspect the semiconductor device.

A first substrate has through holes formed at positions corresponding to the first electrodes. Probe pins are fixed in the through holes, each of the probe pins having a vertical shape. A second substrate has a rewiring layer for extending a pitch of the first electrodes and penetration electrodes for drawing out the first electrodes to a back surface. A contact is disposed between the penetration electrodes and the second electrodes and has conductivity and elasticity only in a vertical direction.

Herein, the probe pin may be made by a metal material having a spring characteristic. The contact may be an anisotropic conductive sheet.

Each of the first and second substrates is preferably a silicon substrate. The first silicon substrate may be covered with an insulating layer for insulating between the probe pins.

The probe pins are desirably disposed with the same space as the fist electrodes. Here, the rewiring layer and the penetration electrode serve as a drawing-out pattern for connecting the probe pins to the inspection substrate.

In this event, a pitch of the second electrodes is extended wider than the pitch of the first electrode, and the rewiring layer is drawn out so as to extend the pitch of the second electrode.

The probe pin and the penetration electrode may be offset with a distance predetermined for re-wiring. The contact may have a tip portion and may be made by burying metal fine lines into a material having elasticity, and the tip portion may be protruded from a surface of the contact.

In this case, the metal fine line preferably has a vertical shape. Alternatively, the metal fine line may be inclined obliquely. Instead, the metal fine line may have an S literature shape.

The contact may be made so as to have elasticity in shape by a metal fine line with a spring characteristic disposed in opposition to each of the second electrodes. The metal fine line preferably has a covering material with elasticity. Herein, a portion having the rewiring layer and the penetration electrode may be multi-layered.

More specifically, according to this invention, the structural body having the metal probe pin with the spring characteristic, the rewiring layer for extending the pitch, and the penetration electrode for drawing out to the back surface together is employed as the probe. Consequently, the resistance of the pin itself can be reduced, and the increase of the resistance generated by drawing out the wire can be suppressed at minimum. Thus, test can be carried out at a high speed.

Moreover, the thickness of the semiconductor device, the thickness of the external electrode, the warping of the inspection substrate, and the slope of the total device can be extremely reduced by combining with the anisotropic conductive sheet, thus obtaining a stable and accurate contact.

DESCRIPTION OF PREFERRED EMBODIMENTS (First embodiment)

Figure 1:
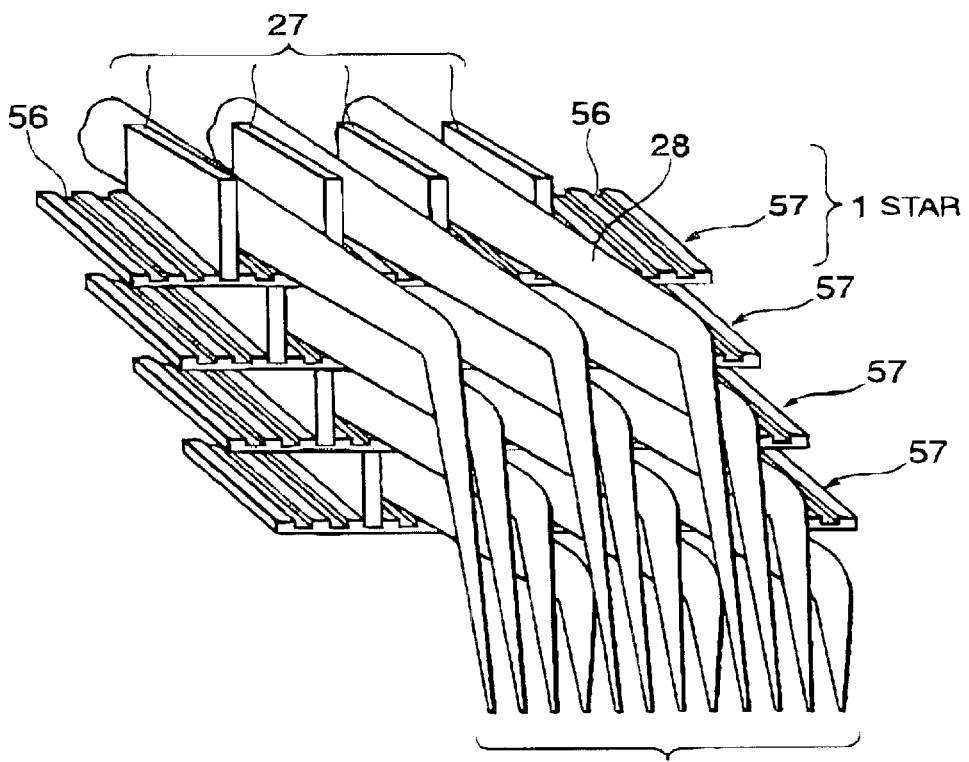
FIG. 1 is a diagram showing a probe according to a first prior art.
Figure 2:
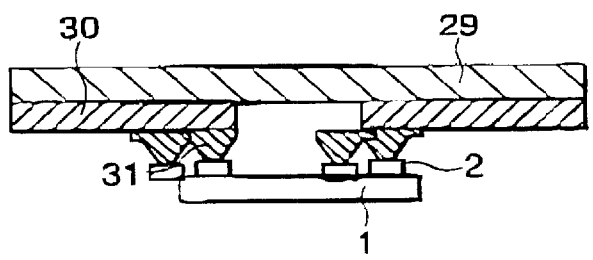
FIG. 2 is a diagram showing a probe according to a second prior art.
Figure 3:
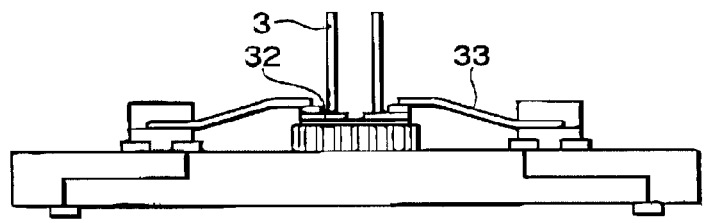
FIG. 3 is a diagram showing a probe according to a third prior art.
Figure 4:
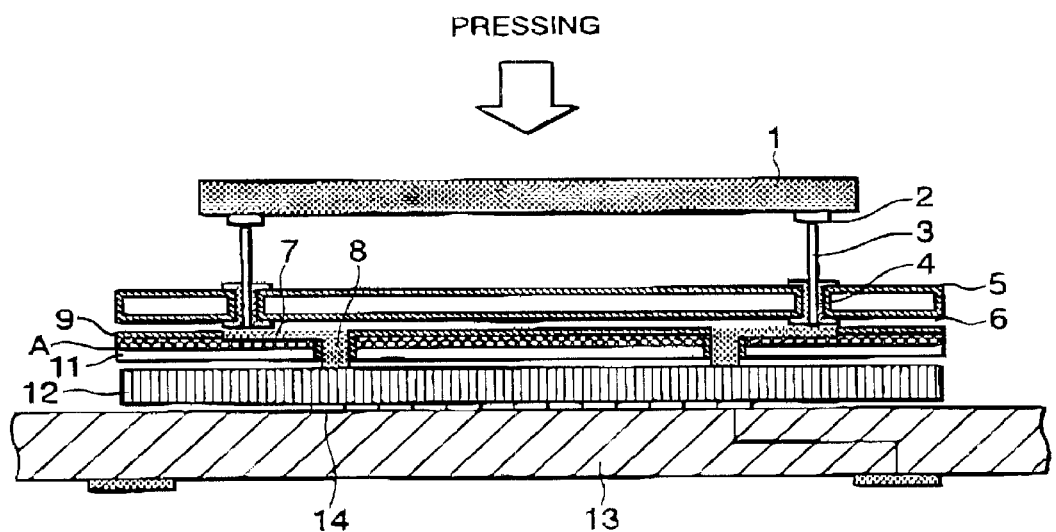
FIG. 4 is a diagram showing a probe according to a first embodiment of this invention.

Referring to FIG. 4, description will be made about a first embodiment of this invention.

As illustrated in FIG. 4, a probe according to the first embodiment includes a silicon substrate 6 as a base, a silicon substrate 11 as a base structural body, and an anisotopic conductive sheet as a contact 12.

With this structure, the silicon substrate 6 has probe pins 3 each of which is formed by a metal material so as to contact with an external terminal electrodes 2 of a semiconductor device 1 to be inspected. The silicon substrate 11 includes a rewiring layer 7 for extending an electrode pitch and a penetration electrode 8 for drawing out the electrode to a back surface thereof. The contact 12 has conductivity only in a vertical direction as well as elasticity.

The probe pin 3 is made of a metal material having a spring characteristic such as nickel, and is directed to a vertical direction or may be slightly inclined in one direction. Under this circumstance, when the probe pin 3 contacts with the external terminal electrode 2 of the semiconductor device 1 to be inspected, buckling deformation occurs for the probe pin 3, thereby eliminating variation of the thickness of the semiconductor device 1 as well as the thickness of the external terminal electrode 2.

The probe pin 3 is fixed in a penetration through hole (TH) 4 of the silicon substrate 6, which is disposed at the corresponding position with the probe pin 3. The silicon substrate 6 is covered with an insulating layer 5 so as to insulate between probe pins 3.

Here, a plurality of the probe pins 3 are formed with the same space of a plurality of the external terminal electrodes 2 of the semiconductor device 1. The rewiring layer 7 and the penetration electrode 8 serves as a drawing pattern for connecting the probe pins 3 with the inspection substrate 13, and are formed by dry-etching the silicon substrate 11 with a hard coat layer 10. In this case, exposed portions of inside and outside are plated.

For example, when a pitch of electrode pads 14 of the inspection substrate 13 is extended wider than a pitch of the external terminal electrodes 2 of the semiconductor device 1, the re-wiring layer 7 serves as the wiring pattern drawn out to extend the pitch.

Herein, a method drawing out the rewiring layer 7 depends upon the number of the electrodes of the semiconductor device 1, an electrode pitch, and an electrode arrangement. An insulating layer 9 is formed so as to insulate between the wires and insulate against the silicon substrate 11 positioned thereunder.

The penetration electrode 8 is protruded from the silicon substrate 11 at the side of the contact 12. The anisotropic conductive sheet as the contact 12 is vertically buried with fine metal lines inside a silicone rubber so that the tip of the fine line is protruded from the surface of the silicone.

Figure 5:
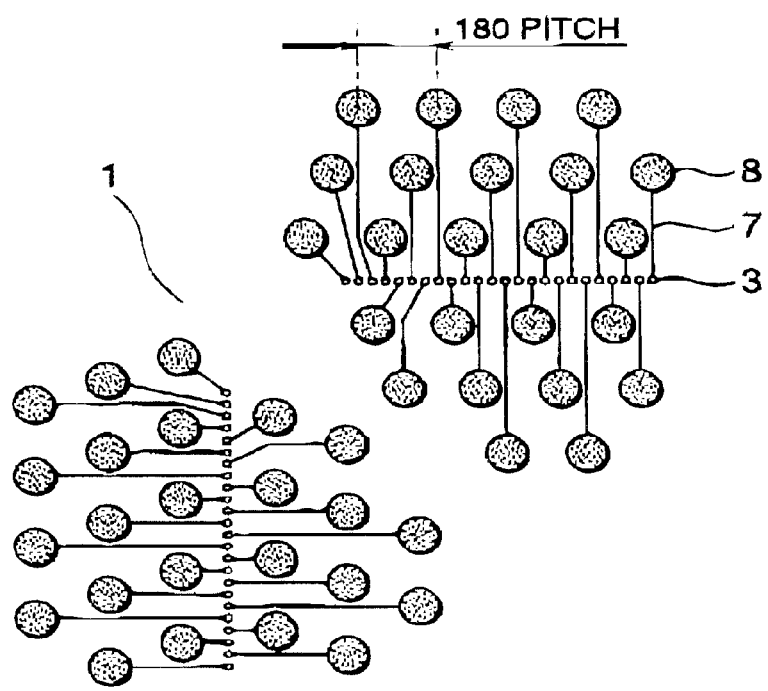
FIG. 5 is a plan view showing a probe according to a first embodiment of this invention.

Meanwhile, an example of pitch extension is illustrated in FIG. 5. In a rewiring method illustrated in FIG. 5, the external terminal electrodes 2 of the semiconductor device 1 are arranged with the pitch of 30 $\mu$m at periphery.

When the rewiring layers 7 are drawn out in three lines at both sides of the probe pin 3, the pitch of the penetration electrode portion after rewiring is equal to a 180 $\mu$m. In this case, the pitch of the probe pins 3 is also equal to 30 $\mu$m, the height thereof is equal to 1000 $\mu$m or less, and an upper portion area of the probe pin 3 is on the order 15 $\mu$m in diameter.

The metal fine line of the contact 12 arranged at the under surface is formed by tungsten or beryllium copper, a line diameter is equal to 30 μm or less, and the periphery portion thereof is plated with gold. In this event, the fine pitch falls within the range between about 30 and 50 μm in both X and Y directions, and a sheet thickness is not greater than 1 mm.

Under the above-mentioned circumstance, the probe pin 3 is slightly offset for the penetration electrode 8 in the cause of the rewiring. This offset will give no affect for transmission of an applied pressure force. In the case that an offset quantity becomes high by forming a multilayer film because of the pitch extension, it is preferable to apply a pressure in vacuum so that the probe pin is exposed, thus realizing the contact between the contact 12 and the inspection substrate 13 in advance.

Subsequently, description will be hereinafter made about a method for manufacturing a portion having the probe pin 3, the rewiring layer 7 extended in pitch, and the penetration electrode 8 according to the first embodiment with reference to FIGS. 6A through 6I and FIGS. 7A through 7I.

Initially, a method for manufacturing the probe pin 3 will be explained with reference to FIGS. 6A through 6I.

Figure 6:
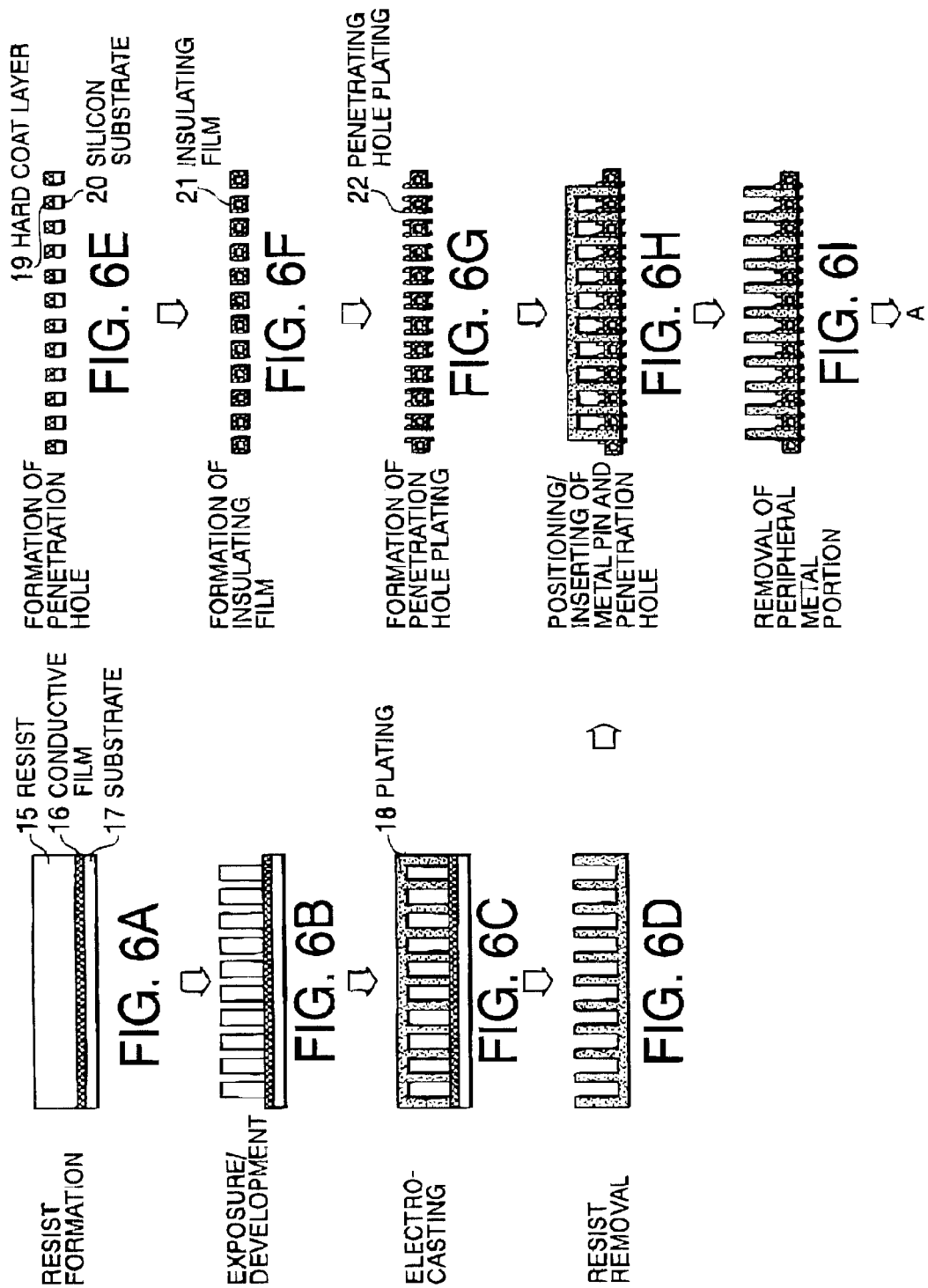
FIGS. 6A through 6I are a flow chart showing production steps for manufacturing a probe according to a first embodiment of this invention.

A resist 15 made of PMMA (poly methyl methacrylate) is formed to a desired thickness (1000 μm or less) on a substrate 17 with a conductive film 16, as illustrate in FIG. 6A.

Thereafter, exposure/development/etching is carried out, as illustrated in FIG. 6B. In this step illustrated in FIG. 6B, an X-ray is employed as an exposure light ray, and a mask having an X-ray absorber band is used so as to be resistant to the X-ray. By employing the X-ray, high aspect ratio (100 or less) can be achieved.

Successively, nickel is laminated by electrocasting, as illustrated in FIG. 6C.

Subsequently, the substrate 17 and the resist 15 are removed to thereby obtain a desired pin shape, as illustrated in FIG. 6D.

In the meantime, an $SiO_2$ film as a hard coat layer 19 is deposited to a thickness of about 2 μm by CVD (Chemical Vapor Deposition) on a silicon substrate having a penetration through hole, as illustrated in FIG. 6E. Further, a penetration hole is formed by the use of a processing technique such as a RIE (Reactive Ion Etching) method, a laser method (for example, KrF, THG-YAG), and an EB (Electron Beam) method, as illustrated in FIG. 6E.

Thereafter, an inorganic film is deposited on a sidewall of the penetration hole by the CVD method so as to insulate between the silicon substrate and a penetration via, and Ti/W or Cr is formed as a barrier metal layer on the sidewall of the penetration hole, as illustrated in FIG. 6F Successively, the penetration hole is plated with gold by the use of an electrolytic plating method or an electroless plating method, as illustrated in FIG. 6G.

Subsequently, the metal pin and the penetration through hole of the silicon substrate are positioned to each other, and the metal pin is forced into the through hole so that the tip of the metal pin is protruded with about 20 μm or less from the back surface of the penetration through hole, as illustrated in FIG. 6H.

Then, the base portion of the metal pin is removed by etching, and mechanical polishing is carried out so as to adjust the height of the pin, as illustrated in FIG. 6I.

Thus, the structural body having a metal probe pin with a narrow pitch is formed.

Subsequently, description will be made about a method for manufacturing the structural body having the rewiring layer for extending the pitch and the penetration electrode with reference to FIGS. 7A through 7I.

Figure 7:
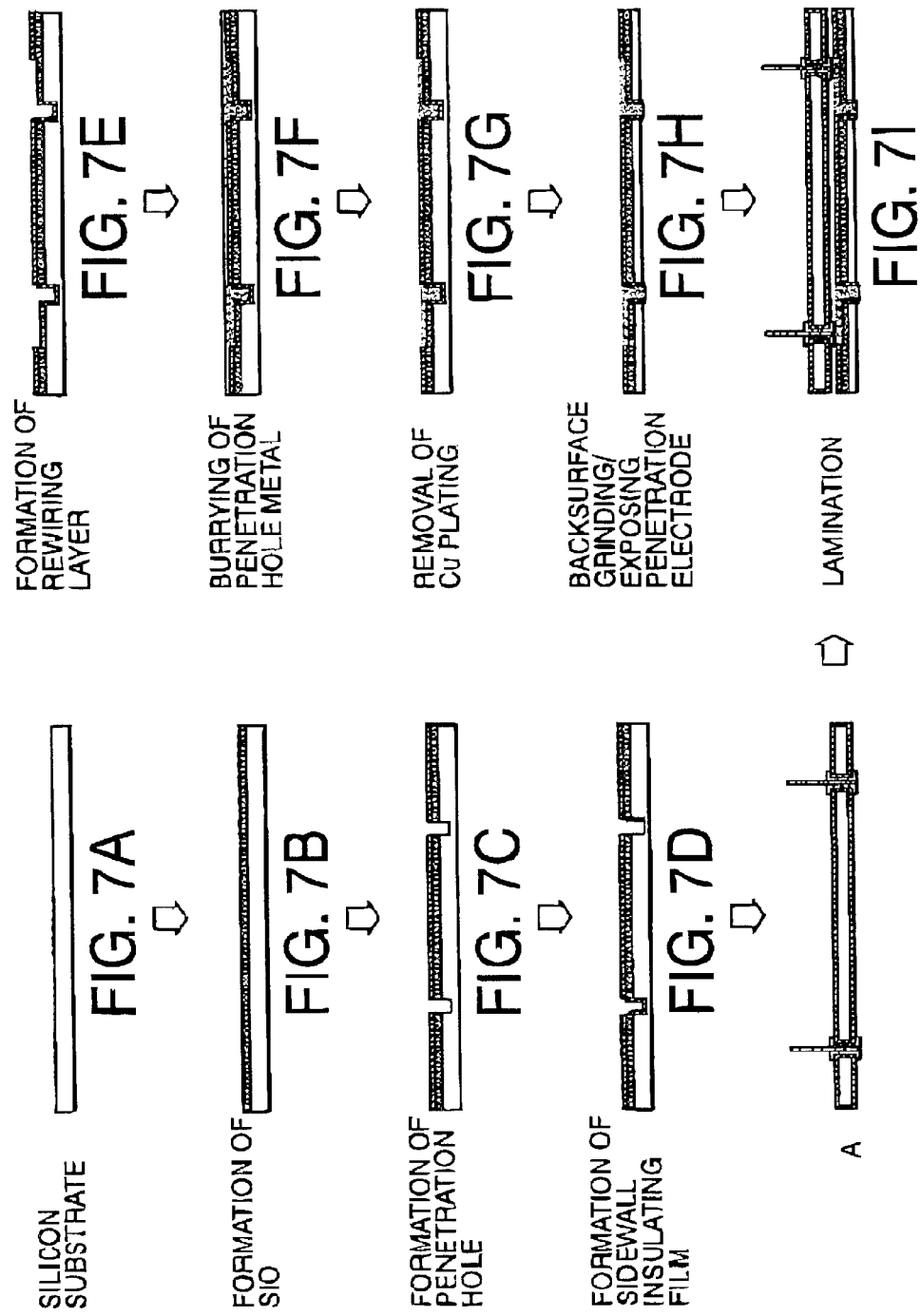
FIGS. 7A through 7I are a flow chart showing production steps for manufacturing a probe according to a first embodiment of this invention.

The hard coat layer is formed on the silicon substrate by the CVD method, and the penetration hole is formed by the use of the aforementioned method, as illustrated in FIGS. 7A through 7C.

Then, the inorganic film is formed on the sidewall of the penetration hole by the CVD method, and Ti/W, Cr or the like is formed on the sidewall of the penetration hole as the barrier metal layer, as illustrated in FIG. 7D.

Successively, a powder metal is prepared with a binder by the electrolytic plating method, the electroless plating method, or the vacuum suction method, is pressed into the through hole by applying a pressure, is buried with a metal such as Cu, Au, W, and Mo by the use of the powder injection method, and finally, an additional Cu layer formed on the upper portion is removed and flattened by the CMP (Chemical Mechanical Polishing) method, as illustrated in FIGS. 7E through 7G.

Further, the back surface is selectively etched in the same manner with the above-mentioned case, and thereby, the surface of the penetration electrode is protruded from the silicon substrate. In this event, metal exposed surfaces of the inside and outside are plated with gold, as illustrated in FIG. 7H.

The structural body having the rewiring layer and the penetration electrode thus formed is combined with the structural body having the metal probe by lamination, thus completing the production process, as illustrated in FIG. 7I.

(Second embodiment)

Figure 8:
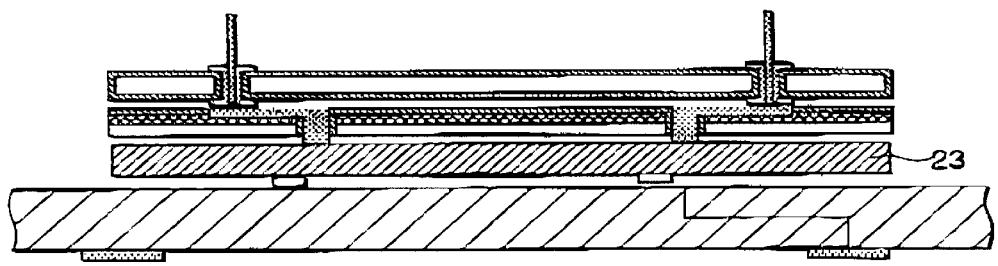
FIG. 8 is a diagram showing a probe according to a second embodiment of this invention.

Referring to FIG. 8, description will be made about a second embodiment of this invention.

As illustrated in FIG. 8, the metal fine lines of the anisotropic conductive sheet as the contact 23 are inclined obliquely.

(Third embodiment)

Figure 9:
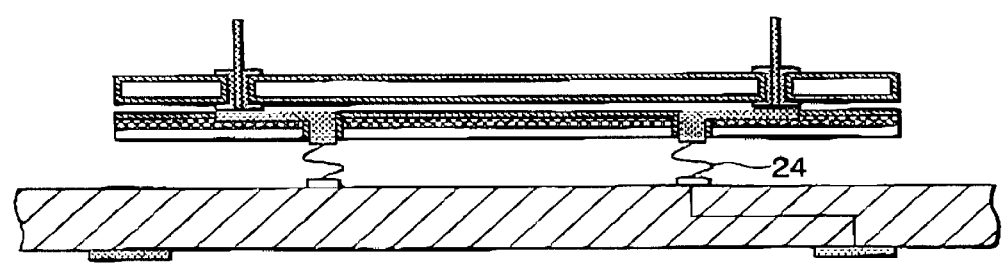
FIG. 9 is a diagram showing a probe according to a third embodiment of this invention.

Referring to FIG. 9, description will be made about a third embodiment of this invention.

As illustrated in FIG. 9, the electrode and the contact are positioned with a relationship of one to one, and the gold wire as the contact 24 is plated so as to have the spring characteristic. In this case, the spring preferably has an S-literature shape.

Other than the structures of the contacts illustrated in FIGS. 8 and 9, the contact disposed on the inspection substrate may have various types in structure. Any structures are usable as long as the contact has the spring characteristic.

(Fourth embodiment)

Figure 10:
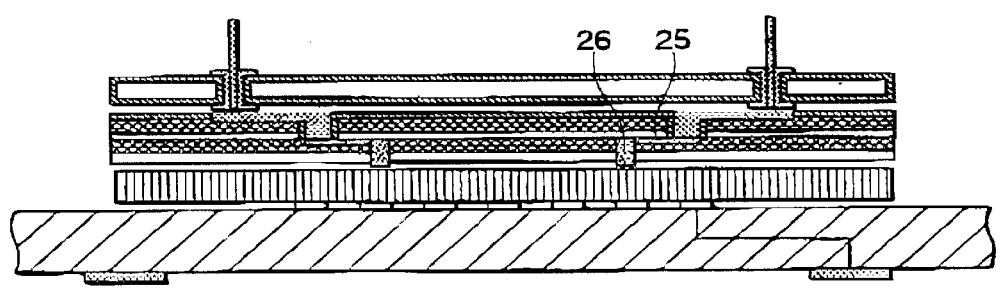
FIG. 10 is a diagram showing a probe according to a fourth embodiment of this invention.

Referring to FIG. 10, description will be made about a fourth embodiment of this invention.

As illustrated in FIG. 10, the portion having the rewiring layer 7 and the penetration electrode 8 is multi-layered, In other words, the portion has a second rewiring layer 25 and a second penetration electrode 26. Thereby, the electrode pitch of the inspection substrate 13 can be further extended.

While this invention has thus far been disclosed in conjunction with several embodiments thereof, it will be readily possible for those skilled in the art to put this invention into practice in various other manners.

What is claimed is:

1. A probe for obtaining an electrical contact between a semiconductor device having a plurality of first electrodes as external terminals and an inspection substrate having a plurality of second electrodes so as to inspect the semiconductor device, comprising:

a first substrate which has through holes formed at positions corresponding to the first electrodes;

probe pins which are fixed in the through holes, each of the probe pins having a vertical shape;

a second substrate which has a rewiring layer for extending a pitch of the first electrodes and penetration electrodes for drawing out the first electrodes to a back surface; and a contact which is disposed between the penetration electrodes and the second electrodes and which has conductivity and elasticity only in a vertical direction.

2. A probe as claimed in claim 1, wherein:
the probe pin is made by a metal material having a spring characteristic.

3. A probe as claimed in claim 1, wherein:
the contact is an anisotropic conductive sheet.

4. A probe as claimed in claim 1, wherein:
each of the first and second substrates is a silicon substrate.

5. A probe as claimed in claim 4, wherein:
the first silicon substrate is covered with an insulating layer for insulating between the probe pins.

6. A probe as claimed in claim 1, wherein:
the probe pins are disposed with the same space as the first electrodes.

7. A probe claimed in claim 1, wherein:
the rewiring layer and the penetration electrode serve as a drawing-out pattern for connecting the probe pins to the inspection substrate.

8. A probe claimed in claim 7, wherein:
a pitch of the second electrodes is extended wider than the pitch of the first electrode, and
the rewiring layer is drawn out so as to extend the pitch of the second electrode.

9. A probe as claimed in claim 1, wherein:
the probe pin and the penetration electrode are offset with a distance predetermined for rewiring.

10. A probe as claimed in claim 1, wherein
the contact has a tip portion and is made by burying metal fine lines into a material having elasticity, and
the tip portion is protruded from a surface of the contact.

11. A probe as claimed in claim 10, wherein:
the metal fine line has a vertical shape.

12. A probe as claimed in claim 10, wherein:
the metal fine line is inclined obliquely.

13. A probe as claimed in claim 10, wherein:
the metal fine line has an S literature shape.

14. A probe as claimed in claim 1, wherein:
the contact is made so as to have elasticity in shape by a metal fine line with a spring characteristic disposed in opposition to each of the second electrodes.

15. A probe as claimed in claim 14, wherein:
the metal fine line has a covering material with elasticity.

16. A probe as claimed in claim 1, wherein:
a portion having the rewiring layer and the penetration electrode is multi-layered.

17. A method of manufacturing a probe for obtaining an electrical contact between a semiconductor device having a plurality of first electrodes as external terminals and an inspection substrate having a plurality of second electrodes so as to inspect the semiconductor device, comprising the steps of:

forming metal pins at positions corresponding to the first electrodes;

forming through holes at the positions with respect to a first substrate;

positioning ad fixing the metal pins into the through holes;

forming a rewiring layer for extending a pitch of the first electrodes and penetration electrodes for drawing out the first electrodes into a back surface between the metal pins and the second electrodes with respect to a second substrate ; and laminating the first substrate with the metal pins and the second substrate with the rewiring layer and the penetration electrodes.

18. A method as claimed in claim 17, wherein:
the probe pin is formed by a metal material having a spring characteristic.

19. A method as claimed in claim 17, wherein:
the rewiring layer and the penetration electrode serve as a drawing-out pattern for connecting the probe pins into the inspection substrate.

20. A method as claimed in claim 17, wherein:
the contact is formed so as to have elasticity in shape by a metal fine line with a spring characteristic disposed in opposition to each of the second electrodes.

* * * * *